United States Patent [19]

Blossfeld

[11] Patent Number: 4,509,250
[45] Date of Patent: Apr. 9, 1985

[54] PROCESS FOR MANUFACTURING A MONOLITHIC INTEGRATED CIRCUIT COMPRISING AT LEAST ONE BIPOLAR PLANAR TRANSISTOR

[75] Inventor: Lothar Blossfeld, Freiburg, Fed. Rep. of Germany

[73] Assignee: ITT Industries, Inc., New York, N.Y.

[21] Appl. No.: 530,526

[22] Filed: Sep. 9, 1983

[30] Foreign Application Priority Data

Sep. 20, 1982 [EP] European Pat. Off. ........ 82108669.1

[51] Int. Cl.³ .................. H01L 21/98; H01L 21/223; H01L 21/265
[52] U.S. Cl. ..................................... 29/578; 29/571; 29/577 C
[58] Field of Search .............. 29/577 C, 578; 148/1.5; 357/34, 35, 43, 51

[56] References Cited

U.S. PATENT DOCUMENTS

| 4,079,504 | 3/1978 | Kosa | 29/578 |
| 4,258,380 | 3/1981 | Roger | 357/34 |
| 4,269,636 | 5/1981 | Rivoli et al. | 29/578 |
| 4,311,532 | 1/1982 | Taylor | 148/1.5 |
| 4,317,690 | 3/1982 | Koomen et al. | 29/578 |
| 4,418,469 | 12/1983 | Fujita | 29/577 C |

FOREIGN PATENT DOCUMENTS 56-56663  5/1981  Japan .................................... 357/51

OTHER PUBLICATIONS

Hornung et al., "Direct or Implanted Contacts in Ion Implanted Resistors" IBM Tech. Disclosure Bul. vol. 21, No. 11, Apr. 1979.

Primary Examiner—Brian E. Hearn
Assistant Examiner—Hunter L. Auyang
Attorney, Agent, or Firm—Donald J. Lenkszus

[57] ABSTRACT

In the process according to the invention, in addition to the conventional two photoresist processes for opening the contact holes and for manufacturing the interconnecting pattern, two photoresist processes are used with one photoresist mask each for manufacturing the regions of the planar transistor. Without additional photoresist masks, further semiconductor components, such as integrated resistors and/or lateral transistors are capable of being manufactured. The process is characterized by the fact that, the first photoresist mask is used to manufacture a diffusion masking layer which leaves the base area of the planar transistor unmasked. In this area, the dopings of the collector region are introduced into the substrate and the collector region is diffused. Thereafter, at a relatively small dose rate, there is carried out an implantation of dopings of the base region. Upon removal of the diffusion masking layer and by employing a second photoresist mask, an oxidation masking layer is deposited which covers both the rim portion of the collector region and the emitter area. The oxidation masking layer serves as an implantation mask for the dopings of the external base partial region and for manufacturing an implantation mask of a thermally produced silicon oxide. Through the openings in this implantation mask there is effected the implantation of the dopings of the emitter region and those of the collector connecting region.

4 Claims, 12 Drawing Figures

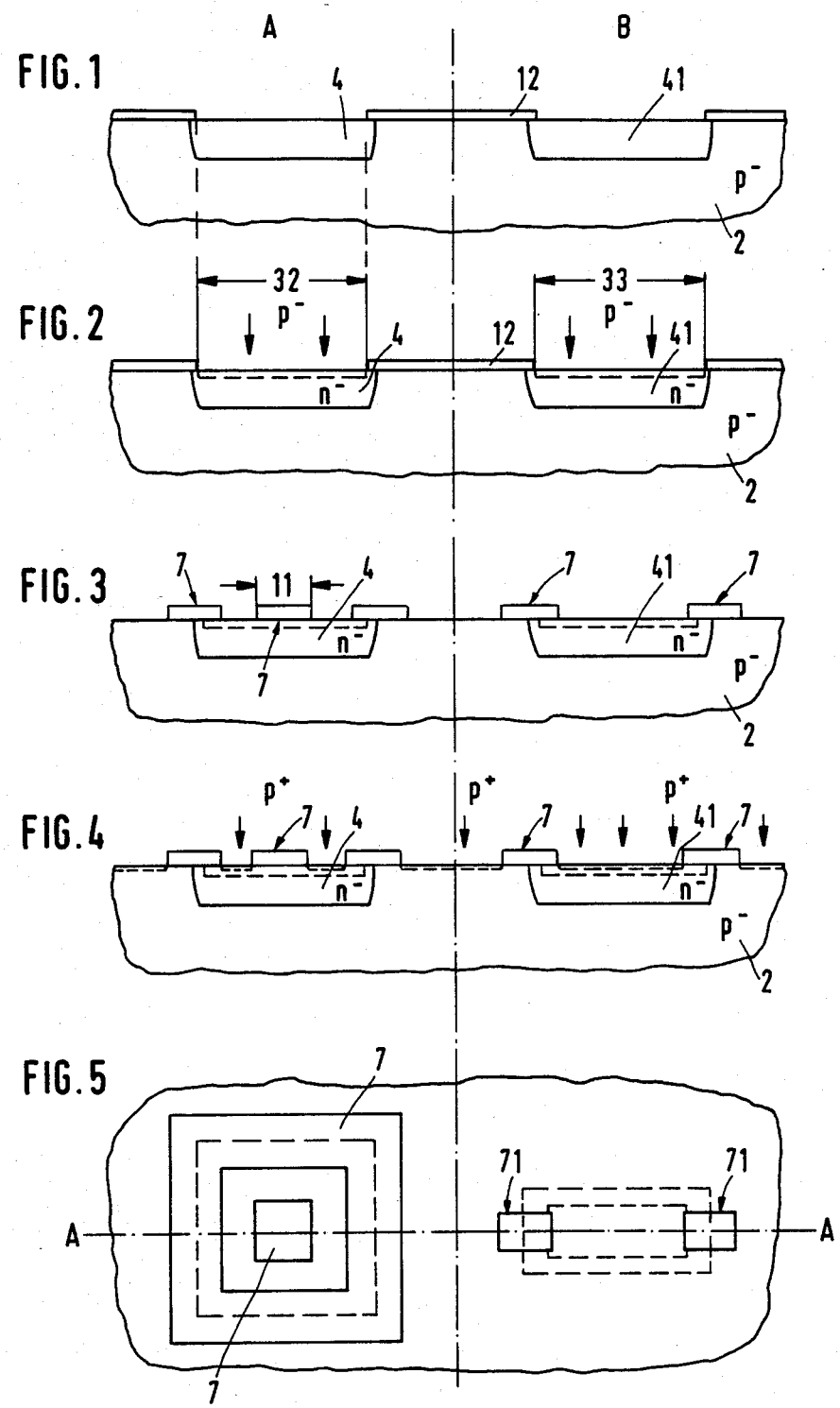

PROCESS FOR MANUFACTURING A MONOLITHIC INTEGRATED CIRCUIT COMPRISING AT LEAST ONE BIPOLAR PLANAR TRANSISTOR

BACKGROUND OF THE INVENTION

This invention pertains to a method for manufacturing integrated circuits. In DE-OS No. 30 09 434 a process is described for manufacturing a monolithic integrated circuit comprising at least one bipolar planar transistor whose emitter region is formed in one surface side of a semiconducting substrate into the base region, which is diffused into the collector region. For manufacturing an integrated bipolar transistor without epitaxy, five photoresist masks are required which are used to manufacture firstly the collector region, secondly the base region, thirdly the emitter region, fourthly the contact holes and fifthly the interconnection pattern. In this process, by employing a first photoresist mask, the collector region is first of all restricted. The dopings of the collector region are implanted in this region and diffused thereafter. Then, by employing a second photoresist mask, the base region is restricted and the dopings of the base region are implanted. Following this, the dopings of the emitter region are implanted into the emitter area. Finally, by employing one photoresist mask, contact holes are produced in the insulating layer covering the surface side and an interconnection pattern is produced on the insulating layer, for contacting the regions.

A considerable proportion of the defect rates in the manufacture of monolithic integrated solid-state circuits are caused by faults during the photoresist processes. Moreover, the manufacturing costs are determined by the number of processes and defect rates. Therefore, it is of great advantage to keep the number of photoresist processes as small as possible, so that apart from an increased yield, it becomes possible to reduce the structures in size and, consequently, to achieve a higher integration density.

SUMMARY OF THE INVENTION

It is one object of the invention, therefore, to provide a method which permits the manufacture of integrated planar transistors by employing only four photoresist processes.

In the process according to the invention, besides the conventional two photoresist processes for opening the contact holes and for manufacturing the interconnecting pattern, two photoresist processes are used with one photoresist mask each for manufacturing the regions of the planar transistor. A feature of the process is that further semiconductor components, such as integrated resistors and/or lateral transistors, may be manufactured without additional photoresist masks.

The process is characterized by the fact that, the first photoresist mask is utilized to manufacture a diffusion masking layer which leaves the base area of the planar transistor unmasked. In this area, the dopings of the collector region are introduced into the substrate and the collector region is diffused. Thereafter, at a relatively small dose rate, an implantation of dopings of the base region is carried out. Upon removal of the diffusion masking layer and by employing a second photoresist mask, an oxidation masking layer is deposited which covers both the rim portion of the collector region and the emitter area. The oxidation masking layer serves as an implantation mask for the dopings of the external base partial region and for manufacturing an implantation mask of a thermally produced silicon oxide. Through the openings in this implantation mask there is effected the implantation of the dopings of the emitter region and those of the collector connecting region.

BRIEF DESCRIPTION OF THE DRAWINGS

The invention will be better understood from a reading of the following detailed description in conjunction with the drawings in which:

FIGS. 1 to 7 show cross sectional views taken through part of a monolithic integrated solid-state circuit, during process steps in which a bipolar planar transistor and an integrated resistor according to one example of embodiment of the process according to the invention are manufactured;

DETAILED DESCRIPTION

Figure 6:
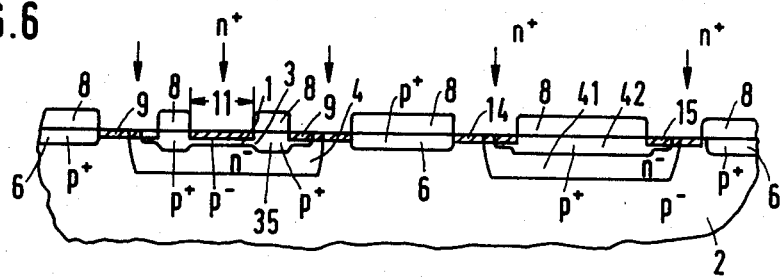

Apart from the advantage that the process according to the invention merely requires the use of four photoresist masks, this process still offers the advantage of being suitable for further development as regards the manufacture of further circuit elements by providing a monolithic integrated circuit without requiring a further photoresist mask, that is, with regard to the manufacture of integrated resistors and planar lateral transistors. For this reason, in the example of embodiment to be described hereinafter, FIGS. 1 to 7 refer to the manufacture of a monolithic integrated circuit which chiefly contains vertical planar transistors and diffused resistors. This is the case with a monolithic integrated digital-to-analog converter. In FIGS. 1 to 7, a vertical planar transistor is fabricated on the side designated A and a diffused resistor is fabricated on the side designated B.

Since npn planar transistors have more favorable electrical properties than pnp planar transistors, the illustrative process preferably started out from a p-doped substrate 2 which, with a view to high breakdown voltages, is weakly doped. As can be seen from FIG. 1, a diffusion masking layer 12 is produced on the surface side of the substrate 2 which, as is shown in part A of FIG. 2, leaves the base area 32 of the planar transistor unmasked, and is manufactured by employing a first photoresist mask. In part B, the area 33 of a resistance region 41 of the integrated resistor remains unmasked.

Upon removal of the photoresist mask, the surface side is subjected to an ion implantation process for implanting ions of the doping material of the collector region 4 or of the resistor region 41. The doping material is inserted and diffused into the semiconductor surface in this way. From this there is obtained an arrangement of the type as shown in FIG. 1.

After this, into the exposed surface of the substrate 2, hence within the base area 32 of the planar transistor and the area 33 of the integrated resistor, there is introduced the doping material of the collector region 4 as well as that of the resistor region 41 with a first relatively small dose into the semiconductor surface by way of ion implantation. The diffusion masking layer 12 serving as an implantation mask, so that an arrangement of the type as shown in FIG. 2 will be obtained.

Now, the diffusion masking layer 12 is removed and, by employing a second photoresist mask, there is produced an oxidation masking layer 7 which covers both the emitter area 11 and the marginal area or base rim portion 32. In part B of the monolithic integrated circuit, by correspondingly shaping the second photoresist mask, there is formed the oxidation masking layer 7 in such a way that alone the contacting regions 71 (cf. FIG. 5) will remain which merely cover portions of the marginal area of the area region 33. The oxidation masking layer 7, however, is of a frame-shaped design within the base rim portion 32.

FIG. 4 shows how, subsequently thereto, by employing the oxidation masking layer 7 as an implantation masking, ions of the base region type have been implanted into the exposed semiconductor surface at a relatively high dose rate. This semiconductor surface is not only exposed next to the emitter area 11 (cf. FIG. 3) within the base area 32 and within the zone area 33, but also between the circuit components, hence also between the planar transistor and the integrated resistor, so that after a high-temperature process, there will result channel stopper regions 6 as can be seen from FIGS. 6 through 9. FIG. 5 shows the topological conditions in a top view, with the section A—A referring to FIG. 4.

Due to the relatively high dose of ions of the conductivity type of the base region, the internal base region area below the emitter area 11, can be low ohmically contacted via an external base region portion 35 which, in the present case, is of frame-shaped design, as can be seen from FIG. 6.

After this, the exposed semiconductor surface is thermally oxidized, so that relatively thick pad shaped insulating layer portions 8 of silicon oxide will result. These portions are used as an etching mask for removing the portions of the oxidation masking layer 7. Upon completion of the etching processes, there is obtained an arrangement of the type as shown in FIG. 6. In the course of a thermal aging process following a preceding deposition of an oxide layer, the implanted impurities are activated and slightly diffused into the substrate 2. Apart from the emitter region 1 and the base region 3, there are formed within the area below the removed oxidation masking layer 7, the frame-shaped collector contacting region 9 and the contacting regions 14 and 15 of the integrated resistor.

By employing the third photoresist mask there is effected subsequently thereto, the opening of the contact holes at the regions to be contacted and, thereafter by employing a fourth photoresist mask, together with the formation of the interconnection pattern, there is effected the attaching of the emitter contact E to the emitter region 1, of the base contact B to the external base region 35, of the collector contact C to the collector region 4, and of the contacts K1 and K2 to the contacting regions 14 and 15 of the integrated resistor.

Figure 7:
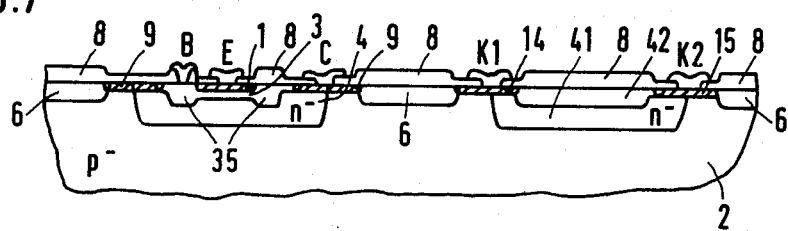

In the case of the integrated resistor as shown in FIG. 7, the region 41 as produced in the course of the collector diffusion, is contacted below the surface area 42 via the regions 14, 15.

Figure 8:
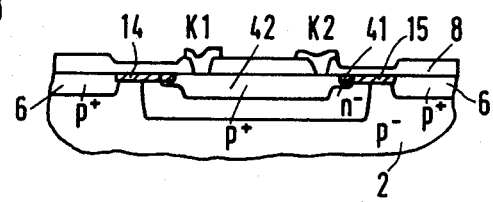
FIG. 8 shows a further type of embodiment of an integrated resistor which is capable of being manufactured by employing the process according to the invention.

Another embodiment of an integrated resistor is shown in FIG. 8. The integrated resistor in FIG. 8 is obtained by contacting the surface area 42 to the contacts K1 and K2, in which case the regions 14, 15 are of annular design.

To summarize the preceding, the process for manufacturing a monolithic integrated circuit comprising at least one bipolar planar transistor includes the following steps:

(a) On the surface side of the substrate 2, by employing a first photoresist mask, a diffusion masking layer 12 is produced which leaves the base area 32 on the substrate 2 unmasked.

(b) Thereafter, the doping material of the collector region 4 is introduced and diffused into the semiconductor surface within the base area 32. Then the doping material of the base region 3, in a first relatively small dose, is introduced into the semiconductor surface by ion implantation and utilizing the diffusion masking layer 12 as the implantation masking.

(c) Thereafter, the diffusion masking layer 12 is removed. By employing a second photoresist mask, an oxidation masking layer 7 is produced on the semiconductor surface. The oxidation masking layer covers both the emitter area 11 and the base rim portion 32 in a frame-shaped manner.

(d) Thereafter, the oxidation masking layer 7 is utilized as an implantation mask and ions of the base region type are implanted into the exposed semiconductor surface with a second relatively high dose rate. Subsequently, the exposed semiconductor surface is thermally oxidized by forming a new implantation mask 8, during which the implanted ions are activated.

(e) Finally, by employing a third photoresist mask, the contact holes are opened and, by employing a fourth photoresist mask, the interconnection pattern is produced.

By using the process according to the invention, it is also easily possible to manufacture a substrate npn transistor in the monolithic integrated circuit. For this purpose, the oxidation masking layer portion within the area 11 (FIG. 3) is omitted due to the corresponding embodiment of the second photoresist mask. Accordingly, the silicon oxide layer 8 (FIG. 6) covers the area 31 which is actually intended for the emitter. The third photoresist mask as intended for manufacturing the contact holes, is modified, so that instead of the base contact B of FIG. 7, there is arranged the emitter contact, and instead of the collector contact C, there is provided the base contact, with the substrate 2 being contacted via a special contact hole. The fourth photoresist mask is modified accordingly.

Further in accordance with the invention, it is also possible to manufacture lateral transistors without requiring an additional photoresist process, and merely by modifying the four photoresist masks. One such transistor is shown in a sectional view in FIG. 9. From this sectional view it can be recognized that the n-conducting base region 5 includes three partial regions 51, 52 and 53 overlapping one another. The emitter region 14 is surrounded by the collector region 15. Base contact B1 is contacted via the frame-shaped base contacting region 16. Emitter region 14 is attached to the emitter contact E1. The collector region 15 is attached to the collector contact C1.

Figure 9:
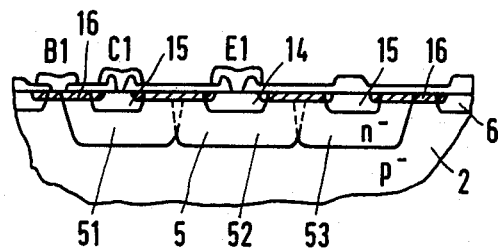
FIG. 9 is a cross sectional view of a planar lateral planar transistor which is capable of being manufactured in accordance with a further embodiment of the process according to the invention, together with a vertical planar transistor.
Figure 10:
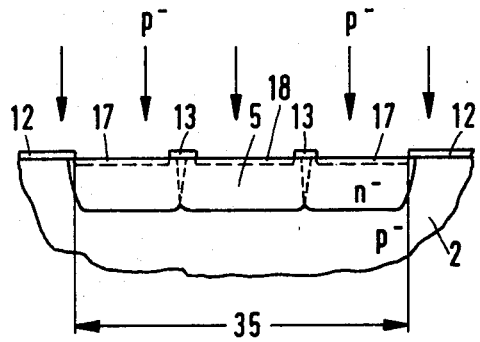
FIGS. 10, 11 and 12 illustrate steps in manufacturing the lateral transistor of FIG. 9.

The integrated lateral planar transistor according to FIG. 9 is manufactured simultaneously with the planar transistor of part A of the monolithic integrated circuit by employing the same four photomasks which, however, are modified slightly at the desired location of the lateral planar transistor. These modifications result from the showings of FIGS. 10, 11 and 12.

During the aforementioned processing step "a" a diffusion masking layer 12 is produced on the surface side of the substrate 2. The masking layer 12 leaves the base area 35 of the lateral planar transistor unmasked with the exception of the web-shaped portions between the emitter region 14 and the collector region 15.

The first photoresist mask used, thus includes web shaped portions so that the web shaped diffusion masking portions 13 resist. The web shaped portions 13 are of a width such that during the diffusion process of step "b" for diffusing the collector region 4 of the planar transistor within the area A of FIGS. 1-5, a continuous base region 5 of the lateral transistor is formed.

Figure 11:
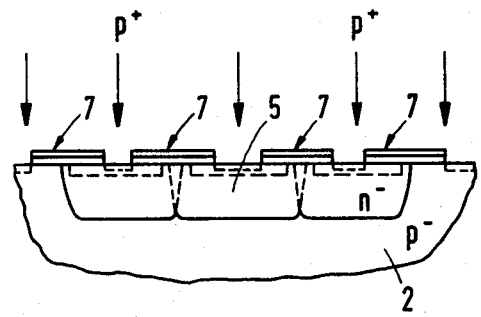

Next, in accordance with the processing step "b", ion implantation of the doping material of the conductivity type of the base region 3 of the planar transistor is carried out so that subsequent to the performance of processing step "b", p-doped surface areas 17 and 18 will be obtained. In accordance with the processing step "b", the diffusion masking layer 12 together with the diffusion masking layer portions 13 is removed. By employing the second photoresist mask which has been modified within the area of the lateral transistor an oxidation masking layer 7 is produced during processing step "c" which covers the rim portions of the base area of the lateral transistor as well as the contact area of the base region 5 thereof, as is illustrated in FIG. 11. Now, during processing step "d", there is effected an implantation of ions of the conductivity type of the base region of the planar transistor, at a relatively high dose rate as specified according to the processing step "d". According, there is then effected a thermal oxidation in the course of which there will result pad-shaped relatively thick oxide layer portions similar to that described hereinbefore with reference to FIG. 6.

Figure 12:
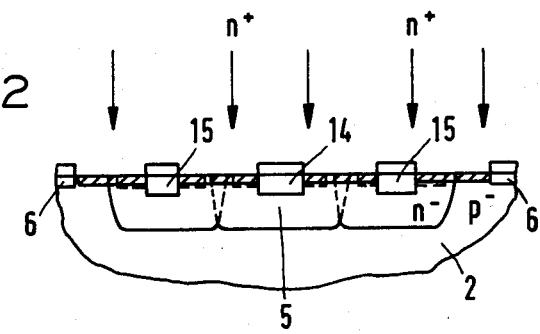

The semiconductor wafer of the monolithic integrated solid-state circuit is now subjected to an etching process for dissolving the oxidation masking layer 7. This layer is likewise removed within the area of the lateral transistor, because there is no masking other than the pad-shaped oxide layer portions which were formed during the aforementioned oxidation process. Following the ion implantation during the processing step "b", there is obtained an arrangement of the type as shown in FIG. 12, and which is thermally oxidized as specified in accordance with the processing step "d".

Finally, by employing the slightly modified third photoresist mask, the contact holes of the lateral transistor are opened and, by employing the fourth slightly modified photoresist mask, there is produced the interconnection pattern required for the interconnection thereof within the integrated circuit. There will then result an arrangement of the type as shown in FIG. 9.

The process according to the invention has the advantage that integrated vertical planar transistors with "noncompensated" emitter regions are capable of being manufactured. Such types of planar transistors have particularly good properties with regard to current amplification and the transition frequency $f_t$ details of which may be found in the article "Emitter Compensation Effect" published in the "Technical Digest IEDM" on pages 514 through 516.

What is claimed is:

1. A process for manufacturing a monolithic integrated circuit comprising at least one bipolar vertical planar transistor whose emitter region is formed in one surface of a semiconducting substrate into a base region which is diffused into a collector region, said process employing a first photoresist mask to produce a diffusion masking layer whereby a collector area is restricted, dopings of a conductivity type of the collector region being implanted and diffused into said collector area;

then employing a second photoresist mask, such that a base area is restricted and dopings of an base region are implanted;

thereafter implanting the dopings of the emitter region into the emitter area; and employing a third photoresist mask to produce, contact holes in an insulated layer covering the surface side, and a fourth mask to produce an interconnection pattern on the insulating layer contacting the regions, characterized by the following processing steps:

(a) employing said first photoresist mask to produce a diffusion masking layer on the surface side of the substrate which leaves the base area on the substrate unmasked; thereafter (b) introducing and diffusing the doping material of the collector region into the semiconductor surface within the base area, and subsequently introducing the doping material of the base region in a first relatively small dose into the semiconductor surface by way of ion implantation and by employing the diffusion masking layer as the implantation masking; thereafter (c) removing the diffusion masking layer and employing a second photoresist mask to produce an oxidation masking layer on the semiconductor surface, said oxidation masking layer covering both the emitter area and the base rim portion in a frame-shaped manner; thereafter (d) by employing the oxidation masking layer as an implantation mask, implanting ions of the base region type into the exposed semiconductor surface with a second relatively high dose rate, and subsequently thereto, thermal oxidizing the exposed semiconductor surface by forming a new implantation mask, in the course of which the implanted ions are activated; and (e) opening contact holes by employing a third photoresist mask and producing an interconnection pattern by employing a fourth photoresist mask.

2. A process in accordance with claim 1, characterized in that for manufacturing an integrated resistor:

during the processing step (a), said diffusion masking layer produced by employing said first photoresist mask leaves unmasked on said substrate the area of a resistor region;

during processing step (b), the doping material of a resistor region is introduced into the semiconductor surface by employing said diffusion masking layer as an implantation mask; and during the processing step (c), said second photoresist mask is employed to produce an oxidation masking layer whch covers the marginal or rim portion of the region area at the contacting areas of the resistor region.

3. A process in accordance with claim 1, characterized in that for manufacturing an integrated lateral planar transistor:

during processing step (a), said diffusion masking layer leaves the base area of said lateral planar transistor unmasked on the semiconductor surface, with the exception of web-shaped portions between the emitter region and the collector region, said portions being covered by web-shaped diffusion masking layer portions having a width such that, during processing step (b), the doping material of the conductivity type of the collector region of said vertical planar transistor forms a continuous base region of the lateral transistor during the diffusion of the collector region of said vertical planar transistor;

during processing step (c), following the removal of the diffusion masking layer and said diffusion masking layer portions, said oxidation masking layer which is produced covers the base rim portions of said lateral transistor and the contacting area of the base region thereof; and during processing step (e) said contact holes of said lateral transistor are opened by employing the third photoresist mask and the interconnection pattern required for the lateral transistor is produced by employing the fourth photoresist mask.

4. A process in accordance with claim 2, characterized in that for manufacturing an integrated lateral planar transistor:

during processing step (a), said diffusion masking layer leaves the base area of said lateral planar transistor unmasked on the semiconductor surface, with the exception of web-shaped portions between the emitter region and the collector region, said portions being covered by web-shaped diffusion masking layer portions having a width such that, during processing step (b), the doping material of the conductivity type of the collector region of said vertical planar transistor forms a continuous base region of the lateral transistor during the diffusion of the collector region of said vertical planar transistor;

during processing step (c), following the removal of the diffusion masking layer and said diffusion masking layer portions, said oxidation masking layer which is produced covers the base rim portions of said lateral transistor and the contacting area of the base region thereof; and during processing step (e) said contact holes of said lateral transistor are opened by employing the third photoresist mask and the interconnection pattern required for the lateral transistor is produced by employing the fourth photoresist mask.

* * * * *